(12) United States Patent
Kimba et al.

(10) Patent No.: US 6,528,778 B1
(45) Date of Patent: Mar. 4, 2003

(54) OPTICAL SENSOR AND OPTICAL UNIT

(75) Inventors: Akio Kimba, Suita (JP); Hiroshi Ueda, Habikino (JP); Iwao Ishida, Higashiosaka (JP)

(73) Assignee: Minolta Co., Ltd., Osaka (JP)

( * ) Notice: Subject to any disclaimer, the term of this patent is extended or adjusted under 35 U.S.C. 154(b) by 0 days.

(21) Appl. No.: 09/327,423

(22) Filed: Jun. 8, 1999

(30) Foreign Application Priority Data

Jun. 9, 1998 (JP) .............................. 10-161083
Apr. 26, 1999 (JP) .............................. 11-118343

(51) Int. Cl.[7] .............................................. H01L 31/00
(52) U.S. Cl. .................................................. 250/214.1
(58) Field of Search ...................... 250/214.1, 208.1, 250/214 R, 239, 551; 358/483, 482; 348/65, 76

(56) References Cited

U.S. PATENT DOCUMENTS

| 4,347,436 | A | * | 8/1982 | Fukuda et al. .......... 250/211 R |
| 4,526,458 | A |   | 7/1985 | Kawamura et al. ......... 354/406 |
| 4,570,076 | A | * | 2/1986 | Hamano et al. ............ 250/578 |
| 5,506,401 | A | * | 4/1996 | Segawa et al. .......... 250/208.1 |
| 6,130,448 | A | * | 10/2000 | Bauer et al. ................ 257/222 |

* cited by examiner

*Primary Examiner*—Michael P. Stafira
(74) *Attorney, Agent, or Firm*—McDermott, Will & Emery

(57) ABSTRACT

In an optical unit such as AF sensor used in a camera, a sensor module is directly fixed on a flexible printed circuit substrate in a manner so that an array of photo-sensing devices formed on the sensor chip is directly connected to conductive patterns on the flexible printed circuit substrate. The printed circuit substrate with the sensor module is held by a sensor holder, and the sensor holder is fixed on an exit opening of a base member of the optical unit in a manner so that the photo-sensing surface of the sensor chip is perpendicular to an optical axis of optical elements such as lenses held on the base member.

30 Claims, 14 Drawing Sheets

OPTICAL SENSOR AND OPTICAL UNIT

This application is based on patent applications Hei.10-161083 and Hei.11-118343 filed in Japan, the contents of which are hereby incorporated by references.

BACKGROUND OF THE INVENTION

1. Field of the Invention

The present invention relates to an optical sensor including a sensor module and a flexible printed circuit substrate and relates to an optical unit including the optical sensor and a base member.

2. Description of the Related Art

An optical unit for sensing an incident light and for outputting an electric signal corresponding to the sensed light is generally known. In such the optical unit, a sensor chip such as a CCD or photodiodes having an array of photo-sensing devices is contained in a package. Output terminals are formed for penetrating walls of the package. Inside ends of the output terminals are connected to the sensor chip in the package, and outside ends of the output terminals are connected to conductive patterns on a flexible printed circuit substrate outside of the package. Thus, output signals from the photo-sensing devices can be transmitted to an external circuit via the output terminals and the flexible printed circuit substrate.

As known, for example, from an automatic focusing (hereinafter abbreviated as AF) sensor, the optical sensor is generally used with other optical elements such as a lens, a mirror, and so on for guiding the incident light to the sensor chip. In a conventional optical unit, the sensor chip is contained in the package, so that it is necessary to place a photo-sensing surface of the sensor chip perpendicular to an optical axis of the optical elements by adjusting a position of the package with respect to the optical elements. However, the adjustment of the position of the package is difficult because it is connected to the flexible printed circuit substrate.

Furthermore, in recent years, it is desired to make a size of a camera be much smaller and thinner in the market. Accordingly, it is further desired to downsize the optical unit which is to be provided in the camera. However, the downsizing of the optical unit has a limit, since the sensor chip is enclosed by the package and the package has a volume. Then, it is proposed to omit the package and to connect the photo-sensing devices of the sensor chip directly on the circuit on the flexible printed circuit substrate further for downsizing the optical unit.

When the package is omitted, the sensor chip is directly held on the flexible printed circuit substrate. The flexible printed circuit substrate, however, has insufficient strength to hold the sensor chip directly, so that it is difficult to assemble the flexible printed circuit substrate with the sensor chip at a predetermined position with respect to the optical elements in the optical unit and to adjust the photo-sensing surface of the sensor chip to be perpendicular to the optical axis if the optical elements. Furthermore, the sensor chip on the flexible printed circuit substrate is directly exposed, so that it is necessary to shield undesirable incident light reaching to the photo-sensing surface of the sensor chip except from an exit opening of the base member of the sensor unit.

SUMMERY OF THE INVENTION

An object of the present invention is to provide an optical sensor in which a flexible printed circuit substrate holding a sensor chip is reinforced for having a sufficient strength so as to be treated in an assemble process without using any package.

Another object of the present invention is to provide an optical unit in which the photo-sensing surface of the sensor chip of the above-mentioned optical sensor is positioned at predetermined distance with respect to optical elements held on a base member and the optical sensor is shielded from the external light except the exit opening of the base member.

Still another object of the present invention is to provide a sensor unit which has a sufficient strength.

An optical sensor in accordance with the present invention comprises: a sensor module including a sensor chip having at least a photo-sensing device provided thereon and a flexible printed circuit substrate having conductive patterns to which the photo-sensing device is connected; and a sensor holder for positioning the sensor module at a light exit opening portion of a base member of an optical unit which holds at least an optical element for guiding an incident light to the sensor module.

Furthermore, an optical unit in accordance with the present invention comprises: a sensor module including a transparent plate, a sensor module having at least a photo-sensing device and a flexible printed circuit substrate having conductive patterns to which the photo-sensing device is connected, and wherein the sensor chip is disposed for facing the transparent plate through an opening of the flexible printed circuit substrate; a base member for holding at least an optical element which guides an incident light to the sensor module, and having a positioning portion to which another surface of the transparent plate contacts for positioning the sensor chip with respect to the optical element and a fixing portion to which the sensor holder is fixed; and a sensor holder for positioning the sensor module at a light exit opening portion of the base member.

Moreover, a sensor unit in accordance with the present invention comprises: a transparent plate capable of transmitting light; a sensor chip provided with a photo-sensing device for sensing light transmitted through the transparent plate, the sensor chip being fixedly attached with the transparent plate; a flexible printed circuit substrate electrically connected with the photo-sensing device; and a holder fixedly attached on the transparent plate, the holder having a shape capable enclosing the sensor chip.

Another sensor unit in accordance with the present invention comprises: a transparent plate capable of transmitting light; a holder fixedly attached with the transparent plate on one side thereof, the holder being formed with an opening; a sensor chip provided with a photo-sensing device for sensing light passed through the opening and the transparent plate, the sensor chip being fixedly attached to the other side of the holder; and a flexible printed circuit substrate electrically connected with and fixedly attached to the sensor chip.

Since the sensor holder serves as reinforcing member of the sensor module or the flexible printed circuit substrate with the sensor chip, the sensor module has sufficient strength so that it is treated in the assemble process. Furthermore, the sensor chip can directly be positioned at the light exit opening portion of the base member of the optical unit by the sensor holder, so that it becomes easy to assemble the flexible printed circuit substrate with the sensor chip at a predetermined position with respect to the optical elements in the optical unit and to adjust the photo-sensing surface of the sensor chip to be perpendicular to the optical axis if the optical elements. As a result, a package conventionally used can be omitted, so that the optical sensor or the optical unit can be made much smaller and thinner. Furthermore, when the optical sensor or the optical unit is used in an equipment, the equipment can consequently be made much smaller and thinner than the conventional one.

DETAILED DESCRIPTION OF THE EMBODIMENT

A first embodiment of an optical sensor and an optical unit in accordance with this invention is described.

Figure 1:
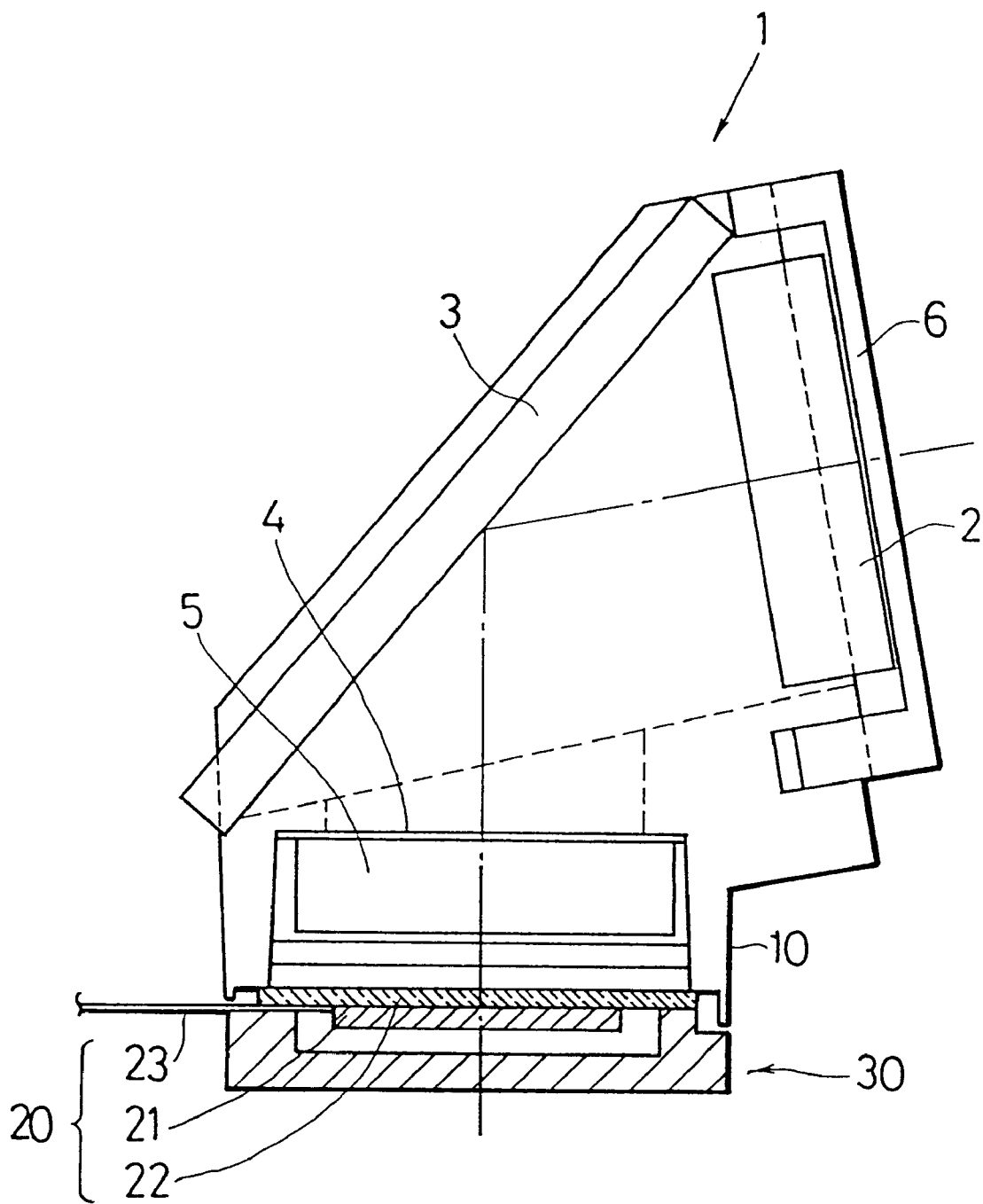
FIG. 1 is a cross-sectional side view showing a configuration of an optical unit in a first embodiment of the present invention.

A configuration of an optical unit in the first embodiment is shown in FIG. 1. The optical unit 1 is, for example, an AF sensor used in a camera for sensing an incident light (an incident image) and for outputting focusing data. The optical unit 1 is configured by a lens holder (base member) 10, a sensor module 20, a sensor holder 30, and so on. The lens holder 10 is a hollow frame for holding optical elements such as a condenser lens 2, a mirror 3, an aperture mask 4 and a separator lens 5 for guiding an incident light to the sensor module 20. The condenser lens 2 is fixed on an incident opening of the lens holder 10 by a lens fixing member 6. The condenser lens 2 refracts the incident light so as to reach the mirror 3. The mirror 3 reflects the incident light to the separator lens 5. The aperture mask 4 is disposed in front of the separator lens 5 for restricting a quantity of the incident light to the sensor module 20. The separator lens 5 is fixed on an exit opening of the lens holder 10. The separator lens 5 separates the incident light into two directions and focuses two images at different positions on the sensor module 20.

The sensor module 20 is configured by a sensor chip 21, a transparent plate 22, a flexible printed circuit substrate 23, and so on. The sensor chip 21 is an alternative of a line sensor having one dimensional array of photo-sensing devices and an area sensor having two dimensional array of the photo-sensing devices. The photo-sensing devices are, for example, a CCD or photodiodes. The transparent plate 22, which is made of transparent material such as glass or hard resin, protects a photo-sensing surface of the sensor chip 21 and reinforces the sensor chip 21 and the flexible printed circuit substrate 23. The sensor chip 21 can be connected to external wiring (not shown) via the flexible printed circuit substrate 23.

When the images are focused on the photo-sensing surface of the sensor chip 21, each photo-sensing device senses the intensity of the incident light and outputs an electric signal corresponding to the intensity. The output signals of the photo-sensing devices correspond to a pattern of the images. Thus, the optical unit 1 serving as the AF sensor can output a defocus quantity which is used for controlling a position of a taking lens of the camera.

The sensor module 20 is held on the sensor holder 30. When the sensor holder 30 and the lens holder 10 are combined, the sensor module 20 is placed in a predetermined condition with respect to an optical axis of the optical elements. Concretely, the photo-sensing surface of the sensor chip 21 is perpendicular to the optical axis of the optical elements. The sensor module 20 and the sensor holder 30 configure an optical sensor.

Figure 2A:
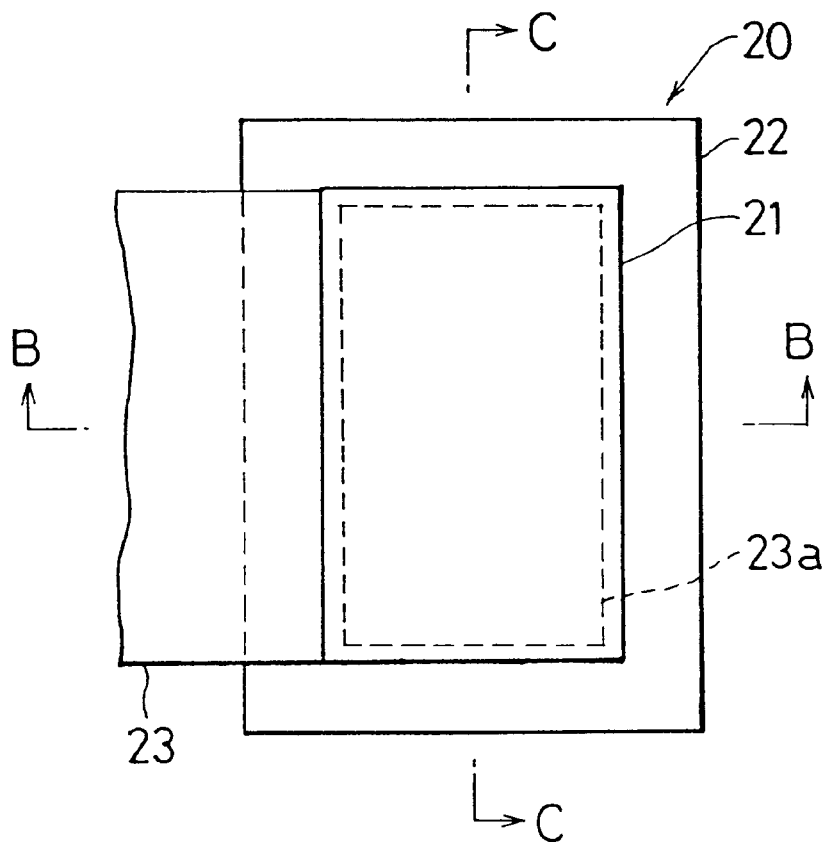
FIG. 2A is a plan view showing a configuration of a sensor module in the first embodiment.
Figure 2B:
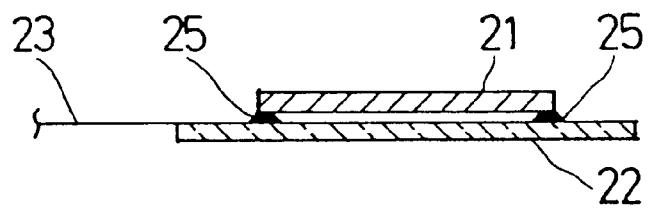
FIG. 2B is a B—B sectional view in FIG. 2A.
Figure 2C:
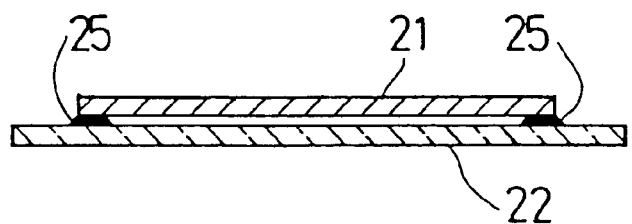
FIG. 2C is a C—C sectional view in FIG. 2A.

The details of the sensor module 20 is described with reference to FIGS. 2A, 2B and 2C. FIG. 2A is a plan view of the sensor module 20. FIG. 2B is a B—B sectional view in FIG. 2A. FIG. 2C is a C—C sectional view in FIG. 2A.

As can be seen from FIG. 2A, the flexible printed circuit substrate 23 has an opening 23a which is a little smaller than an outer size of the sensor chip 21. As shown in FIGS. 2B and 2C, the photo-sensing devices (not shown in the figure) on the sensor chip 21 are connected to conductive bumps 25 of conductive patterns on the flexible printed circuit substrate 23.

Figure 3A:
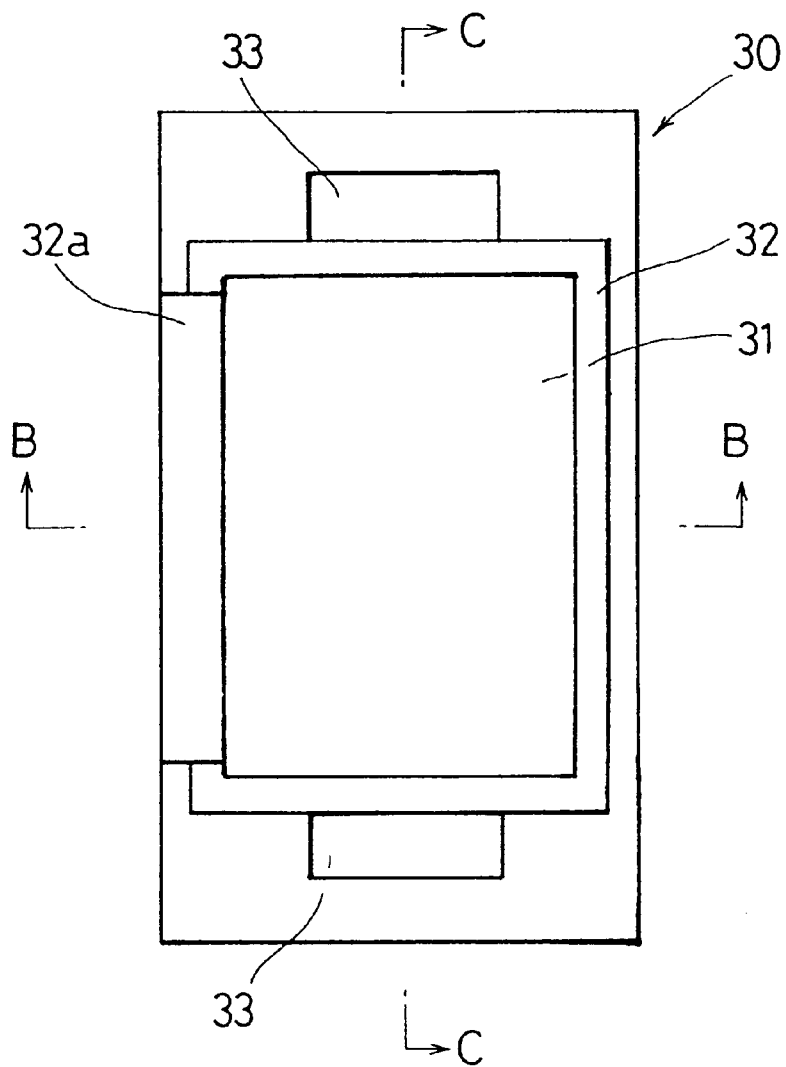
FIG. 3A is a plan view showing a configuration of a sensor holder in the first embodiment.
Figure 3B:
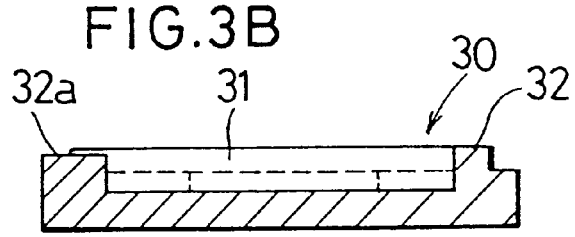
FIG. 3B is a B—B sectional view in FIG. 3A.
Figure 3C:
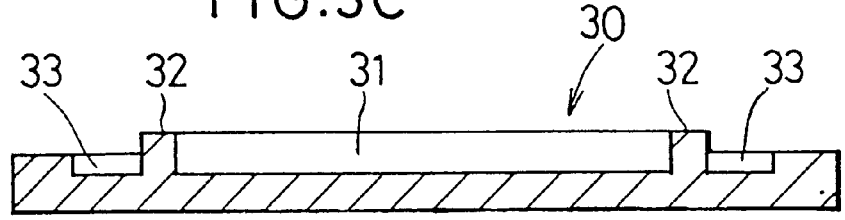
FIG. 3C is a C—C sectional view in FIG. 3A.

The details of the sensor holder 30 is shown in FIGS. 3A, 3B and 3C. FIG. 3A is a plan view of the sensor holder 30.

Figure 4A:
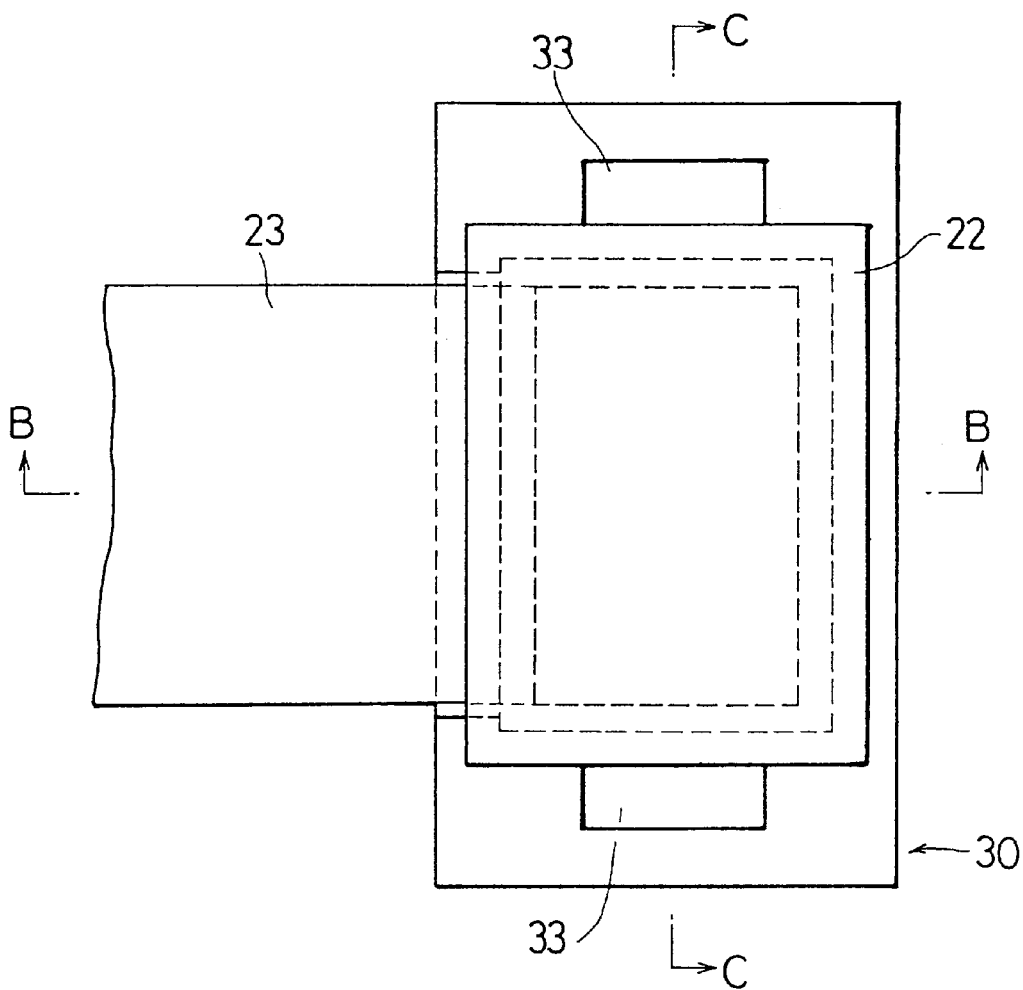
FIG. 4A is a plan view showing a configuration that the sensor module is fixed on the sensor holder in the first embodiment.
Figure 4B:
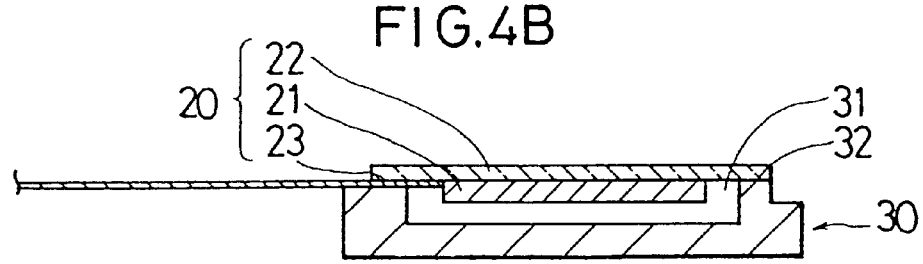
FIG. 4B is a B—B sectional view in FIG. 4A.
Figure 4C:
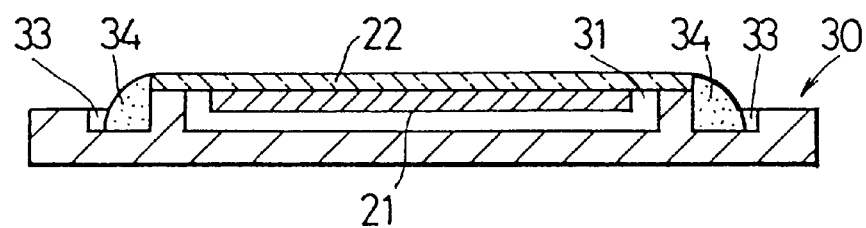
FIG. 4C is a C—C sectional view in FIG. 4A.

FIG. 3B is a B—B sectional view in FIG. 3A. FIG. 3C is a C—C sectional view in FIG. 3A. Furthermore, the sensor module 20 fixed on the sensor holder 30 is shown in FIGS. 4A, 4B and 4C. FIG. 4A is a plan view of the sensor module 20 fixed on the sensor holder 30. FIG. 4B is a B—B sectional view in FIG. 4A. FIG. 4C is a C—C sectional view in FIG. 4A.

As can be seen from FIGS. 4A to 4C, the sensor holder 30 has a rectangular outer shape which is larger than the transparent plate 22 of the sensor module 20. As can be seen from FIG. 3A, the sensor holder 30 has a rectangular concave cavity 31 and a convex fixing walls 32 for forming the cavity 31. Furthermore, concave recesses 33 to which adhesive is filled are formed upper and lower sides of the fixing walls 32 in FIG. 3A. A height of a left wall 32a of the fixing walls 32 is made a little lower than the others. Thus, the flexible printed circuit substrate 23 can smoothly be drawn out from the cavity 31.

As shown in FIGS. 4A to 4C, the sensor chip 21 with the flexible printed circuit substrate 23 is adhered on the transparent plate 22. The transparent plate 22 is adhered on the fixing walls 32 in a manner so that the sensor chip 21 is contained in the cavity 31 and the flexible printed circuit substrate 23 is drawn out from a gap between the transparent plate 22 and the left wall 32a. An adhesive 34 is filled in the recesses 33 so as to adhere the transparent plate 22 with the sensor holder 30 (see FIG. 4C). Thus, the sensor module 20 is fixed on the sensor holder 30.

Figure 5A:
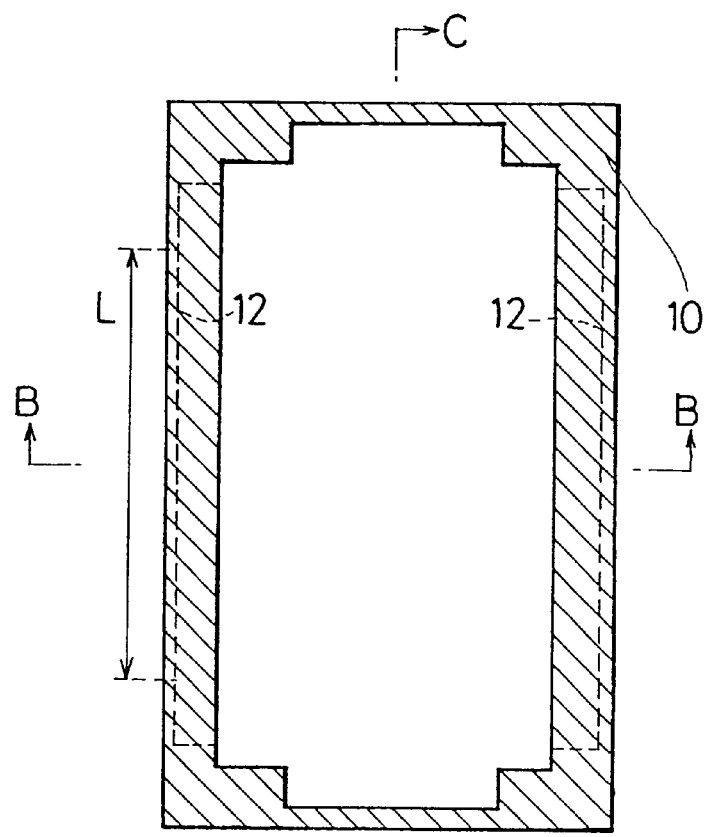
FIG. 5A is a cross-sectional plan view showing a configuration of a lens holder in the first embodiment.
Figure 5B:
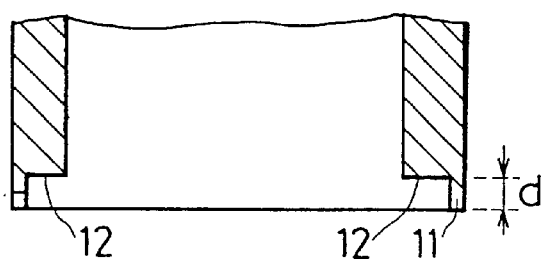
FIG. 5B is a B—B sectional view in FIG. 5A.
Figure 5C:
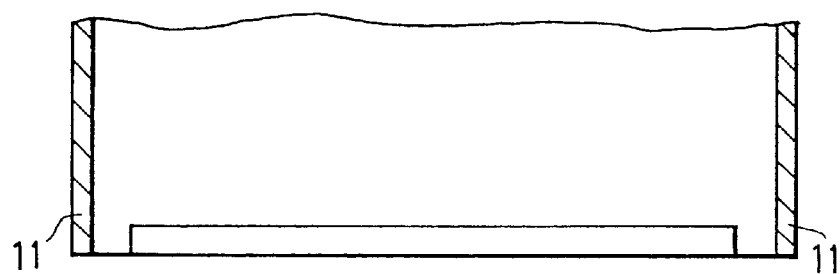
FIG. 5C is a C—C sectional view in FIG. 5A.

The details of a portion of the lens holder 10 in the vicinity of the exit opening thereof is shown in FIGS. 5A, 5B and 5C. FIG. 5A is a cross-sectional plan view of the lens holder 10. FIG. 5B is a B—B sectional view in FIG. 5A. FIG. 5C is a C—C sectional view in FIG. 5A.

As can be seen from FIGS. 5A to 5C, the lens holder 10 has a substantially rectangular opening in a cross section perpendicular to the optical axis of the optical elements. Offset portions 12 having a predetermined depth "d" are formed on right and left side walls 11 of the lens holder 10 except the corners in FIG. 5A. The offset portions 12 are formed at predetermined position with respect to the positions of the optical elements such as the separator lens 5 which are held on the lens holder 10.

Figure 6A:
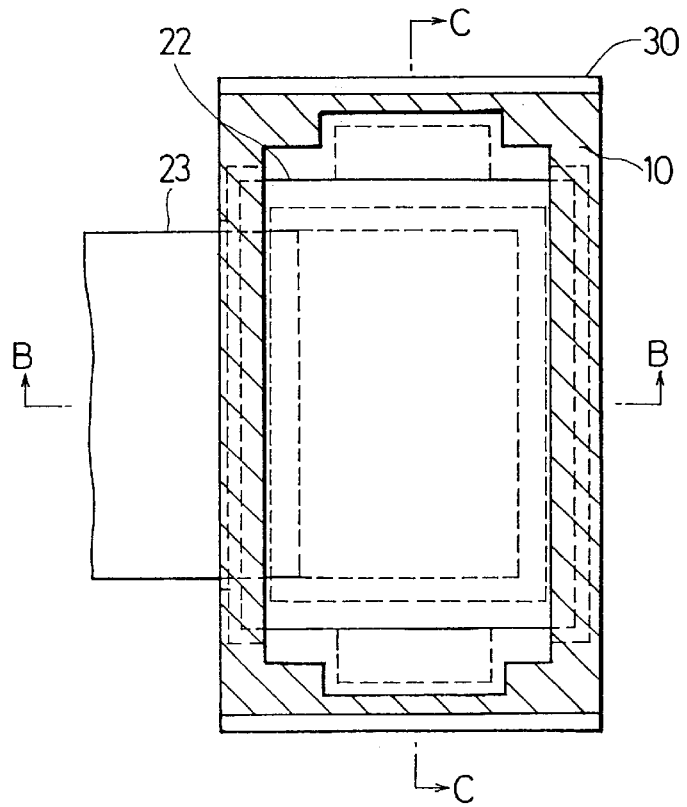
FIG. 6A is a cross-sectional plan view showing that the sensor holder with the sensor module is fixed on the lens holder in the first embodiment.
Figure 6B:
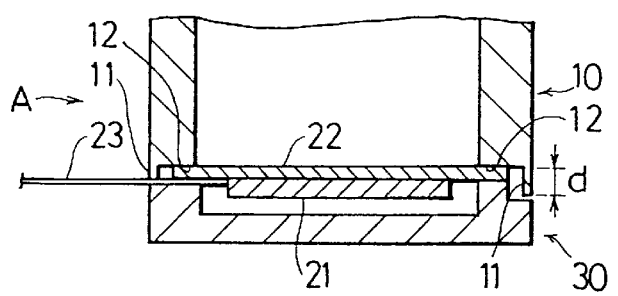
FIG. 6B is a B—B sectional view in FIG. 6A.
Figure 6C:
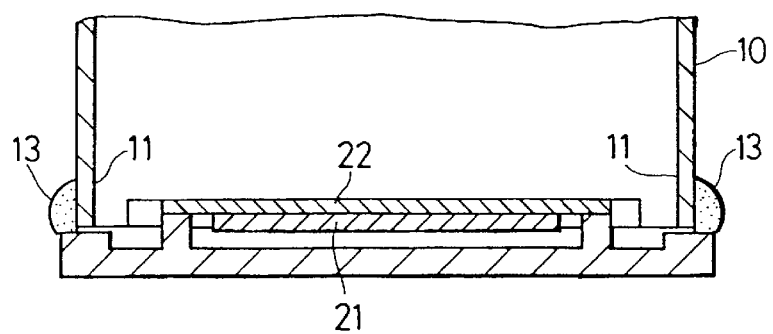
FIG. 6C is a C—C sectional view in FIG. 6A.
Figure 7:
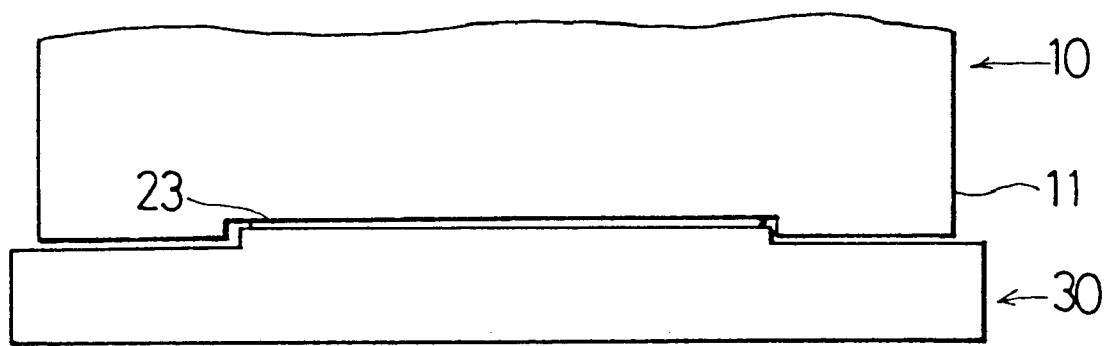
FIG. 7 is a side view showing a fixing portion of the lens holder and the sensor holder in the first embodiment.

Fixing operation of the lens holder 10 and the sensor holder 30 is described with reference to FIGS. 6A, 6B and 6C. FIG. 6A is a cross-sectional plan view of the sensor holder 30 with the sensor module 20 fixed on the lens holder 10. FIG. 6B is a B—B sectional view in FIG. 6A. FIG. 6C is a C—C sectional view in FIG. 6A. FIG. 7 is a side view showing a fixing portion of the lens holder 10 and the sensor holder 30.

As shown in FIGS. 6B and 6C, the sensor holder 30 is engaged with the bottom of the lens holder 10 in a manner so that the transparent plate 22 contacts with the offset portions 12 of the lens holder 10. Under this condition, an adhesive 13 is spread on outside faces of the side walls 11 and the sensor holder 30 so that the sensor holder 30 is fixed on the bottom end of the lens holder 10 (see FIG. 6C).

The depth "d" from the end of the side walls 11 to the offset portions 12 is selected in a manner so that minute gaps are formed between the end of the side walls 11 of the lens holder 10 and top faces of the sensor holder 30. By such the minute gaps, the lens holder 10 and the sensor holder 30 are not directly contacted, but the transparent plate 22 on the sensor holder 30 contacts the offset portions 12.

As can be seen from FIGS. 5A and 5B, the end of the left side wall 11 is cut by a length L. By such a cutting portion, the flexible printed circuit substrate 23 which is connected to the sensor chip 21 can smoothly be drawn out as shown in FIGS. 6B and 7.

By the above-mentioned configuration of the first embodiment, the sensor module 20, in which the photo-sensing devices of the sensor chip 21 are connected to the conductive patterns of the flexible printed circuit substrate 23, can directly be fixed at a portion of the exit opening of the lens holder 10 via the sensor holder 30. Thus, a package which was conventionally used, can be omitted, so that not only the optical sensor but also the optical unit 1 using the optical sensor can be made smaller and thinner. Consequently, the entire size of the camera using the optical sensor 1 can be made smaller and thinner.

The sensor chip 21 is contained in the cavity 31 when the sensor module 20 is fixed on the sensor holder 30, so that the sensor chip 21 can be protected and shielded by the sensor holder 30. When the optical unit 1 is assembled by an automatic manufacturing apparatus, the sensor module 20 can easily be treated by gripping the sensor holder 30. As a result, the position of the sensor module 20 with respect to the lens holder 10 can easily be adjusted.

The lens holder 10 and the sensor holder 30 are fixed under the condition that the transparent plate 22 contacts the offset portions 12, so that positioning error between the optical elements such as the condenser lens 2 in the lens holder 10 and the sensor chip 21 can be reduced and the photo-sensing surface of the sensor chip 21 can easily be adjusted to be perpendicular to the optical axis of the optical elements. Consequently, assemble errors of the optical unit 1 can be made much smaller.

When the lens holder 10 and the sensor holder 30 are fixed, only the transparent plate 22 contacts the offset portions 12, so that the photo-sensing surface of the sensor chip 21 hardly slants with respect to the optical axis of the optical elements held on the lens holder 10. Consequently, positioning errors of the sensor chip 21 can be made much smaller, so that the output signals from the photo-sensing devices of the sensor chip 21 hardly include error component due to the positioning errors.

The transparent plate 22 is not adhered on the lens holder 10, but the lens holder 10 and the sensor holder 30 are adhered. When a trouble occurs in parts such as the optical element held on the lens holder 10, the lens holder 10 can easily be departed from the sensor holder 30 by removing the adhesive on the fixing portion of the lens holder 10 and the sensor holder 30. Thus, the troubled parts can easily changed. Furthermore, the sensor holder 30 can be removed without damaging the sensor chip 21, so that the sensor chip 21 can be reused.

The sensor chip 21 held on the sensor holder 30 is further enclosed by the side walls 11 of the lens holder 10, so that the sensor chip 21 can be shielded from the undesirable external stray light and the sensing accuracy of the photo-sensing devices of the sensor chip 21 can be increased.

The lens holder 10 and the sensor holder 30 are not restricted by the above-mentioned shapes. It is preferable that the lens holder should have a portion for positioning the sensor chip 21 or the transparent plate 22 and a portion for shielding the sensor chip 21. Furthermore, it is preferable that the sensor holder should have a cavity for containing the sensor chip 21. Still furthermore, the lens holder 10 and the sensor holder 30 are not necessarily be fixed by the adhesive. When both of the lens holder 10 and the sensor holder 30 are made of resin, they should be fixed by ultrasonic welding or the like.

Figure 8A:
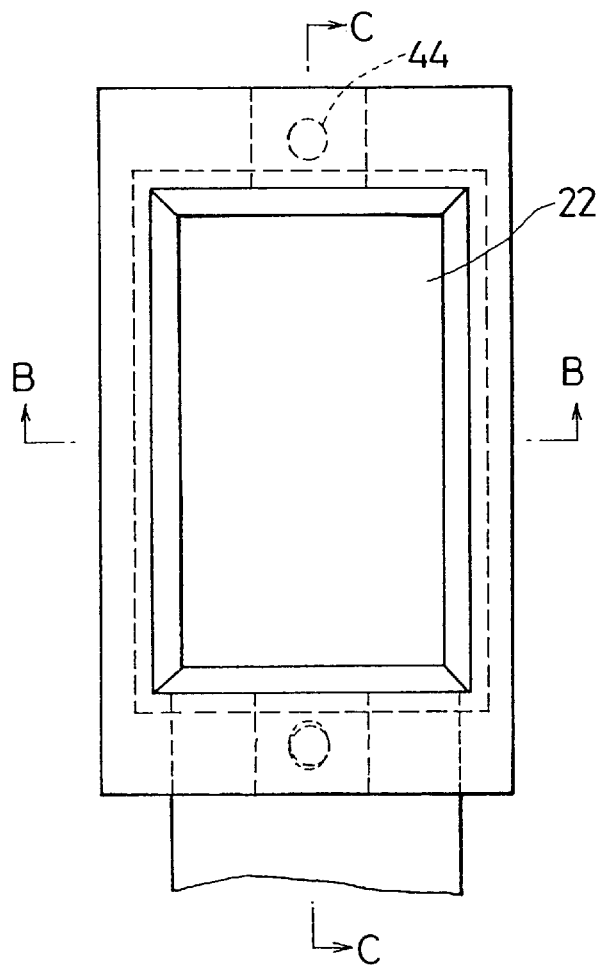
FIG. 8A is a plan view showing a modified configuration that a sensor module is fixed on a sensor holder in the first embodiment.
Figure 8B:
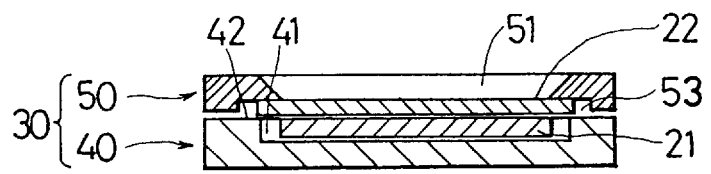
FIG. 8B is a B—B sectional view in FIG. 8A.
Figure 8C:
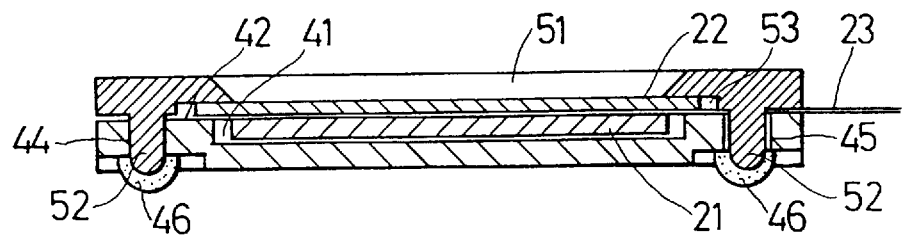
FIG. 8C is a C—C sectional view in FIG. 8A.

A modification of the first embodiment is described with reference to FIGS. 8A, 8B and 8C. FIG. 8A is a plan view showing a condition that the sensor module 20 is fixed on a sensor holder 30 having different configuration. FIG. 8B is a B—B sectional view in FIG. 8A. FIG. 8C is a C—C sectional view in FIG. 8A.

As can be seen from FIGS. 8B and 8C, the sensor holder 30 is configured by a first member 40 and a second member 50. The first member 40 comprises a rectangular concave cavity 41 positioned substantially at the center thereof. The first member 40 serves as a cover of the sensor unit 20. The first member 40 has a circular hole 44 and a pill shaped hole 45 on its side walls 42. A width and a length of the cavity 41 are a little larger than those of the sensor chip 21 but a little smaller than those of the transparent plate 22.

The second member 50 has a rectangular opening 51 having a width and a length which are a little smaller than those of the transparent plate 22 and an offset portion 53 having a width and a length which are a little larger than those of the transparent plate 22. The second member 50 has two bosses 52 which are to be engaged with the holes 44 and 45 of the first member 44.

At first, the sensor chip 21 is contained in the cavity 41 of the first member 40. The transparent plate 22 is placed on the top face of the side walls 42. The second member 50 is further placed on the transparent plate 22 in a manner so that the bosses 52 are engaged with the holes 44 and 45, and the transparent plate 22 contacts the bottom face of the offset portion 53. Under the condition, an adhesive 46 is spread on the ends of the bosses 52 protruded from the holes 44 and 45. Thereby, the first member 40 and the second member 50 are fixed.

By such the modified configuration, the adhesive 46 is not spread on the sensor module 20. When an inferiority of the sensor module 21 is found or when the sensor holder 30 is damaged after fixing the sensor module 20 on the sensor holder 30, the sensor module 20 can be removed without damaging the transparent plate 22.

In this modification, the top face of the second member 50 contacts the offset portion 12 of the lens holder 10 (see FIG. 5B). Thus, it can precisely position the sensor chip 21 of the sensor unit 20 with respect to the optical elements held on the lens holder 10 by forming the thickness of the second member 50 evenly. Furthermore, it is preferable that a positioning portion of the lens holder 10 be formed to protrude, and the transparent plate 22 be directly contact the lens holder 10.

In the above-mentioned first embodiment and the modification thereof, the sensor holder 30 serves as not only a holder of the sensor unit 20 to be fixed on the lens holder 10, but also a shielding member of the sensor chip 21. The back face of the sensor chip 21, however, can have a function for shielding undesirable external stray light. In other words, the sensor chip 21 is not transparent. Thus, it is possible that the sensor holder 30 serves only the holder in such a case. A second embodiment of the invention is described under the assumption that the back face of the sensor chip can shield the external light.

Figure 9:
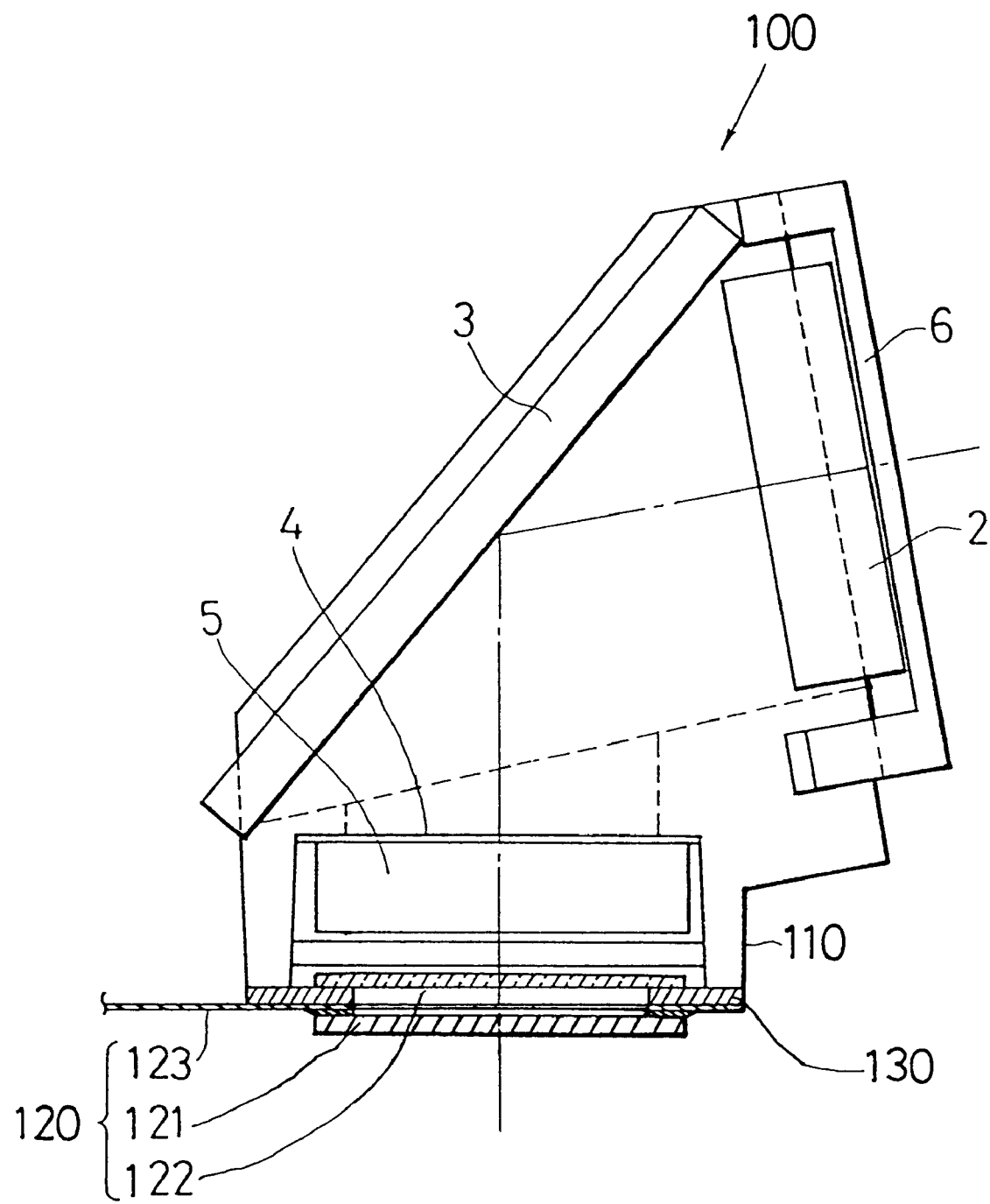
FIG. 9 is a cross-sectional side view showing a configuration of an optical unit in a second embodiment of the present invention.

FIG. 9 shows a configuration of an optical unit in the second embodiment. Elements designated by the same numerals or the same technical terms are substantially the same as those in the above-mentioned first embodiment, so that the explanation of them are omitted.

The optical unit 100 in the second embodiment is also an AF sensor used in a camera. The optical unit 100 is configured by a lens holder 110, a sensor module 120, a sensor holder 130, and so on.

The lens holder 110 is a hollow frame for holding optical elements such as a condenser lens 2, a mirror 3, an aperture mask 4 and a separator lens 5 for guiding an incident light to the sensor module 120.

The sensor module 120 is configured by a sensor chip 121, a transparent plate 122, a flexible printed circuit substrate 123, and so on. The transparent plate 122 in the second embodiment only protects a photo-sensing surface of the sensor chip 121. The sensor chip 121 and the flexible printed circuit substrate 123 are reinforced by the sensor holder 130.

The sensor module 120 is held on the sensor holder 130. When the sensor holder 130 and the lens holder 110 are combined, the sensor module 120 is placed in a predetermined condition with respect to the optical axis of the optical elements. Concretely, the photo-sensing surface of the sensor chip 121 is perpendicular to the optical axis of the optical elements. The sensor holder 130 is, for example, made of a thin plate of a stainless steel or the like in view of the reinforcing and light shielding functions. The material of the sensor frame 130 is not restricted by this embodiment, another material having substantially the same function can be used.

The sensor module 120 and the sensor holder 130 configure an optical sensor. The lens holder 110 and the sensor holder 130 are fixed as mentioned below.

Figure 10A:
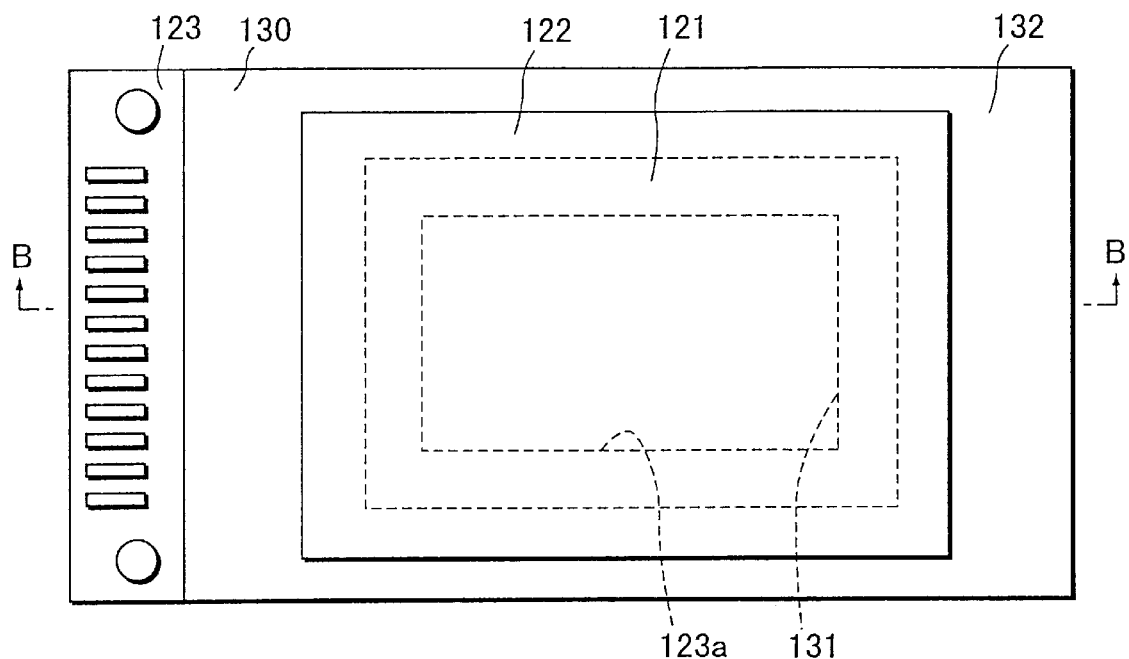
FIG. 10A is a plan view showing a configuration of a sensor module with a sensor holder in the second embodiment.
Figure 10B:
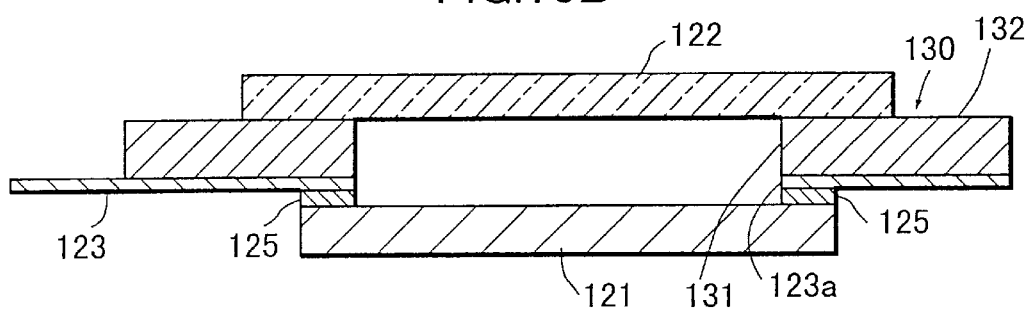
FIG. 10B is a B—B sectional view in FIG. 10A.
Figure 11:
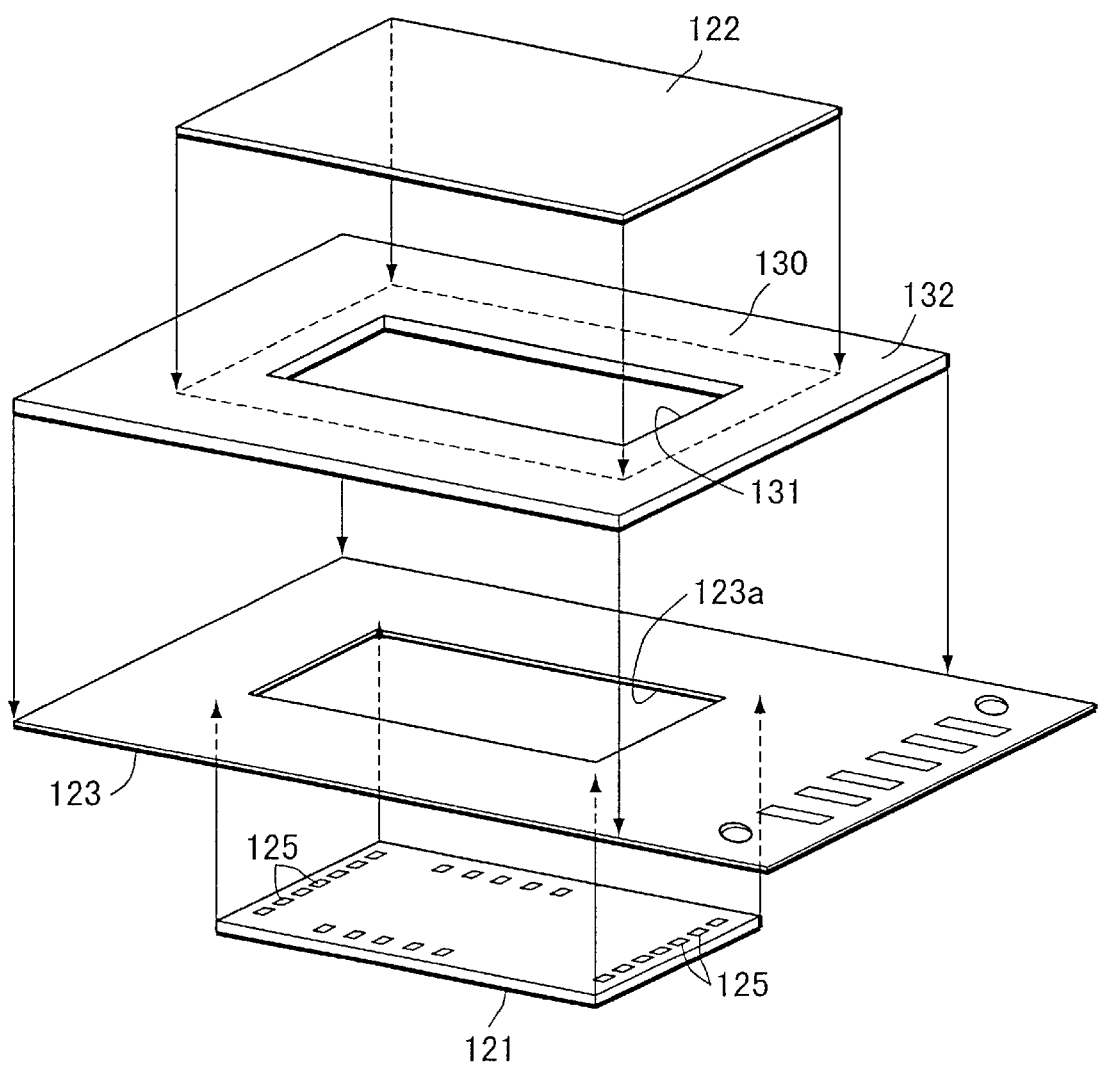
FIG. 11 is an exploded perspective view showing the configuration of the sensor module with the sensor holder in the second embodiment.

The details of the sensor module 120 is described with reference to FIGS. 10A, 10B and 11. FIG. 10A is a plan view of the sensor module 120. FIG. 10B is a B—B sectional view in FIG. 10A. FIG. 11 is a exploded perspective view of the sensor module 120.

As can be seen from FIGS. 10A and 10B, the flexible printed circuit substrate 123 has a rectangular opening 123a having a width and a length a little smaller than those of the sensor chip 121. The photo-sensing devices on the sensor chip 121 are respectively connected to conductive bumps 125 of conductive patterns on the flexible printed circuit substrate 123. A resin having light absorbing function for shielding undesirable stray light is filled in gaps between the bumps 125.

An outer shape of the sensor holder 130 is rectangular which is larger than the shape of the transparent plate 122 of the sensor module 120. The sensor holder 130 has a rectangular opening 131 and a holder portion 132.

As can be seen from FIG. 11, the transparent plate 122 is fixed on the holder portion 132 of the sensor holder 130 by an adhesive. The flexible printed circuit substrate 123 with the sensor chip 121 is fixed on the sensor holder 130 by an adhesive in a manner so that the photo-sensing surface of the sensor chip 121 faces the opening 131 of the sensor holder 130. Thus, the sensor module 120 is fixed on the sensor holder 130, and the sensor chip 121 and the flexible printed circuit substrate 123 are reinforced by the sensor holder 130.

Figure 12A:
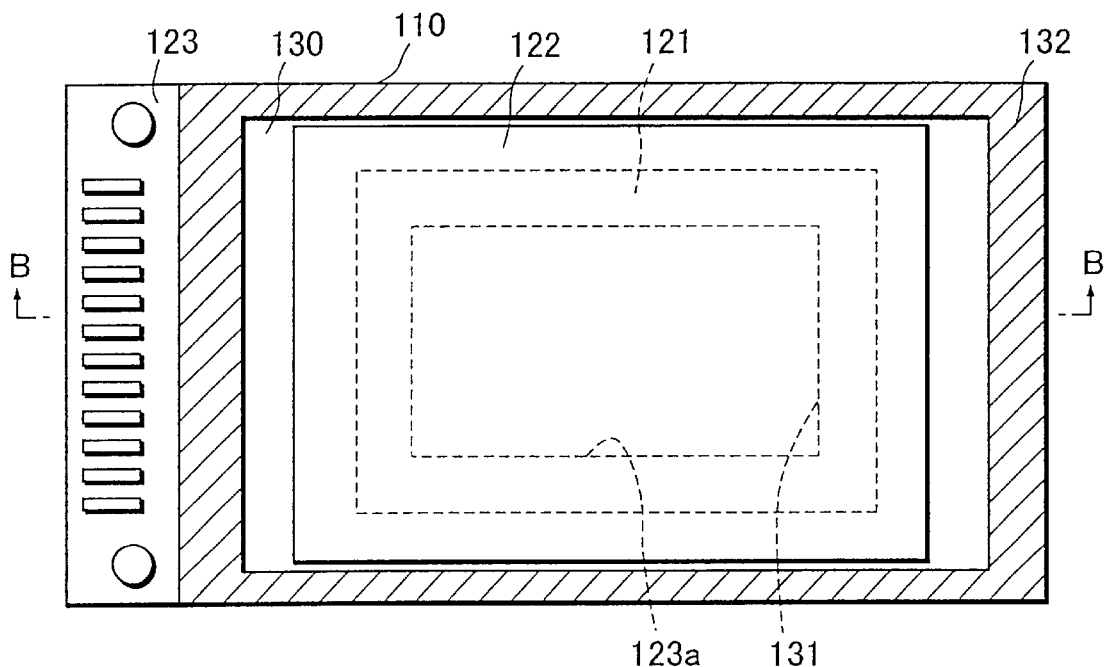
FIG. 12A is a cross-sectional plan view showing a configuration that the sensor module with the sensor holder is fixed on a lens holder in the second embodiment.
Figure 12B:
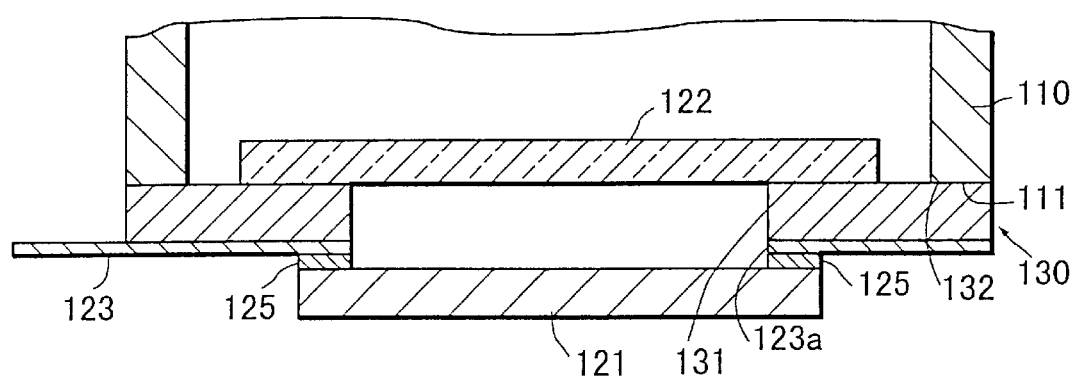
FIG. 12B is a B—B sectional view in FIG. 12A.

A condition that the sensor holder 130 with the sensor module 120 is fixed on the lens holder 110 is shown in FIGS. 12A and 12B. FIG. 12A is a cross-sectional plan view of the sensor holder 130 with the sensor module 120 fixed on the lens holder 110. FIG. 12B is a B—B sectional view in FIG. 12A. In the figures, the lens holder 110 is drawn in the vicinity of the sensor holder 130.

As can be seen from FIG. 12A, the lens holder 110 had a rectangular opening in a cross-section thereof. An end face 111 of the lens holder 110 serves as a positioning portion, so that the end face 111 is positioned at predetermined distances from the optical elements such as the separator lens 5 held on the lens frame 110. The end face 111 of the lens holder 110 and the positioning portion 132 of the sensor holder 130 are contacted and they are fixed by an adhesive.

By the above-mentioned configuration of the second embodiment, the sensor module 120, in which the photo-sensing devices of the sensor chip 121 are connected to the conductive patterns of the flexible printed circuit substrate 123, can directly be fixed at a portion of the exit opening of the lens holder 110 via the sensor holder 130. Thus, a package which was conventionally used, can be omitted. Furthermore, since the sensor chip 121 is not transparent with respect to the undesirable external stray light from the back face thereof, the photo-sensing devices of the sensor chip 121 do not receive the stray light, so that no cavity of the sensor holder 130 for containing the sensor chip 121 is necessary for shielding the sensor chip 121 from the external stray light. Thus, not only the optical sensor, but also the optical unit 100 using the optical sensor can be made much smaller and thinner. Consequently, the camera using the optical unit 100 is also made much smaller and thinner.

When the optical unit 100 is assembled by an automatic manufacturing apparatus, the sensor module 120 can easily be treated by gripping the sensor holder 130. As a result, the position of the sensor module 120 with respect to the lens holder 110 can easily be adjusted.

The lens holder 110 and the sensor holder 130 are fixed under the condition that the end face 111 of the lens holder 110 contacts the fixing portion 132 of the lens holder 130, so that positioning error between the optical elements such as the condenser lens 2 in the lens holder 110 and the sensor chip 121 can be reduced and the photo-sensing surface of the sensor chip 121 can easily be adjusted to be perpendicular to the optical axis of the optical elements. Consequently, assemble errors of the optical unit 100 can be made much smaller.

When the lens holder 110 and the sensor holder 130 are fixed, only the end face 111 of the lens holder 110 contacts the fixing portion 132 of the sensor holder 130, so that the photo-sensing surface of the sensor chip 121 hardly slants with respect to the optical axis of the optical elements held on the lens holder 110. Consequently, positioning errors of the sensor chip 121 can be made much smaller, so that the output signals from the photo-sensing devices of the sensor chip 121 hardly include error component due to the positioning errors.

The transparent plate 122 is not adhered on the lens holder 110, but the lens holder 110 and the sensor holder 130 are adhered. When a trouble occurs in parts such as the optical element held on the lens holder 110, the lens holder 110 can easily be departed from the sensor holder 130 by removing the adhesive on the fixing portion of the lens holder 110 and the sensor holder 130. Thus, the troubled parts can easily changed. Furthermore, the sensor holder 130 can be removed without damaging the sensor chip 121, so that the sensor chip 121 can be reused.

The photo-sensing devices of the sensor chip 121 is enclosed by the sensor holder 130 adhered on the end face 111 of the lens holder 110, so that the sensor chip 121 can be shielded from the undesirable external stray light and the sensing accuracy of the photo-sensing devices of the sensor chip 121 can be increased.

The lens holder 110 and the sensor holder 130 are not restricted by the above-mentioned shapes, it is preferable that the lens holder should have a portion for positioning the sensor chip 121 or the transparent plate 122 and for shielding the sensor chip 121. Furthermore, the sensor holder should have an opening through which the incident light reaches to the photo-sensing devices of the sensor chip 121.

Furthermore, the lens holder 110 and the sensor holder 130 are not necessarily be fixed by the adhesive. When both of the lens holder 110 and the sensor holder 130 are made of resin, they should be fixed by ultrasonic welding or the like.

Figure 13A:
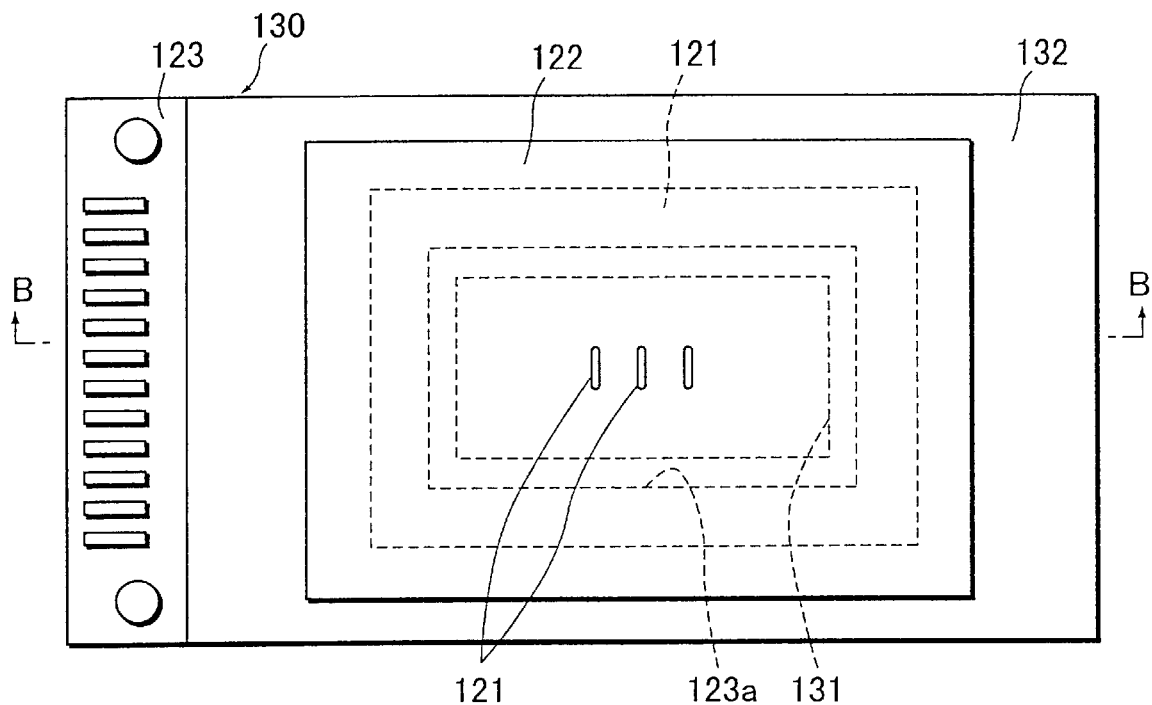
FIG. 13A is a plan view showing a modified configuration of a sensor module with a sensor holder in the second embodiment.
Figure 13B:
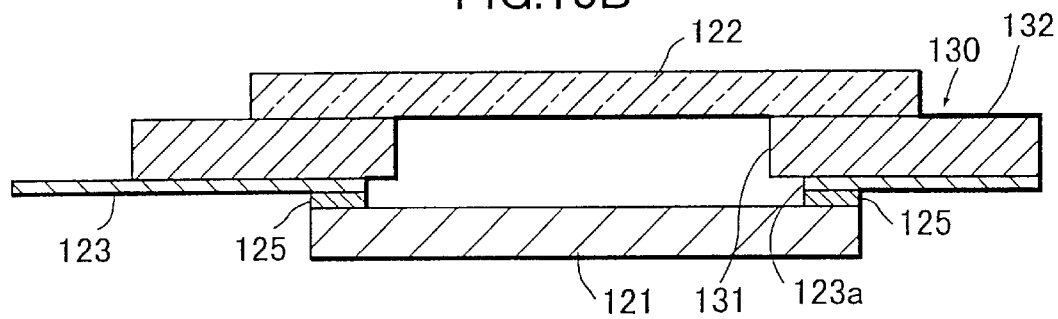
FIG. 13B is a B—B sectional view in FIG. 13A.

A modification of the second embodiment is described. FIG. 13A is a plan view showing a condition that the sensor module 120 is fixed on a sensor holder 130 having different configuration. FIG. 13B is a B—B sectional view in FIG. 13A.

Generally, the photo-sensing devices are unevenly arranged on the photo-sensing surface of the sensor chip 121. When an incident light reaches to the photo-sensing surface of the sensor chip 121 where the photo-sensing devices are not arranged, the incident light will be a stray light which affects the light sensing accuracy. When FIGS. 13A and 13B are compared with the FIGS, 12A and 12B, it can be found that the size of the opening 131 of the sensor holder 130 is made smaller, so that the incident light can reach only a region where the photo-sensing devices 121a are disposed. By such a modified configuration, undesirable surplus incident light may not reach to the region where no photo-sensing device is arranged on the photo-sensing surface of the sensor chip 121, so that the accuracy of the light sensing of the sensor chip 121 can be increased.

Figure 14A:
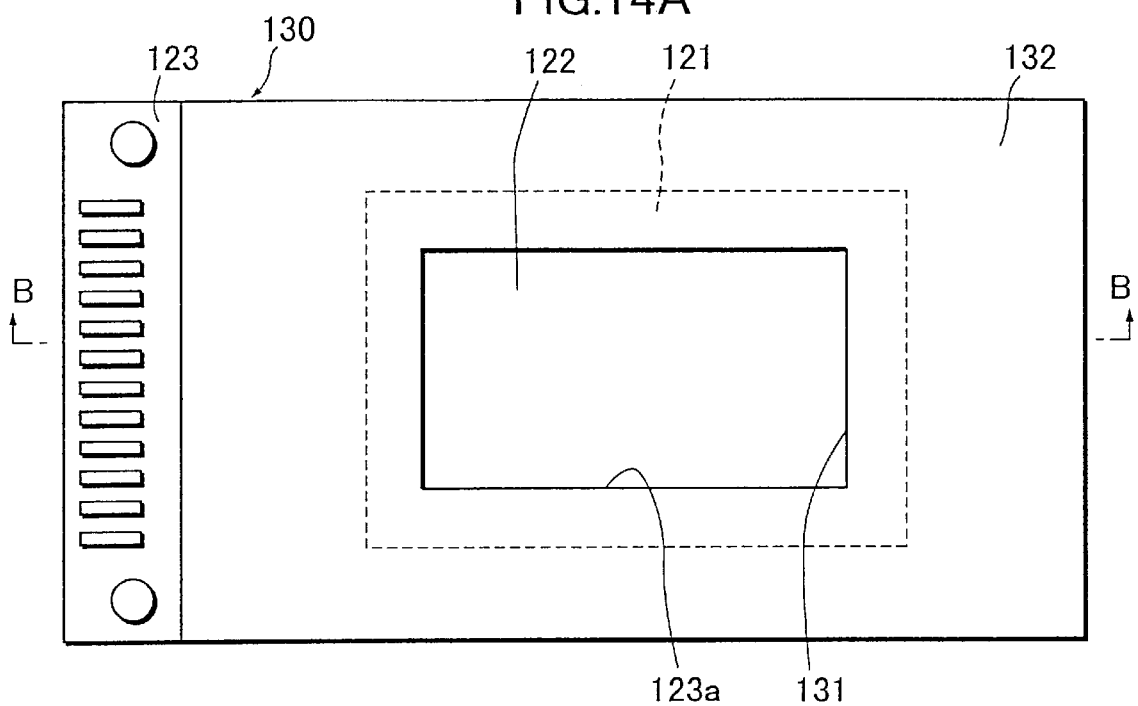
FIG. 14A is a plan view showing another modified configuration of a sensor module with a sensor holder in the second embodiment.
Figure 14B:
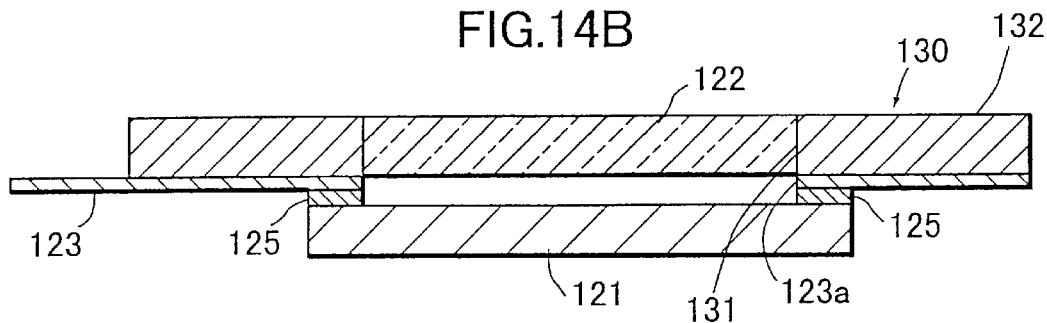
FIG. 14B is a B—B sectional view in FIG. 14A.

Still another modification of the second embodiment is shown in FIGS. 14A and 14B. FIG. 14A is a plan view showing a condition that the sensor module 120 is fixed on a sensor holder 130 having further different configuration. FIG. 14B is a B—B sectional view in FIG. 14A.

As can be seen FIGS. 14A and 14B, the transparent plate 122 is fit in a rectangular opening 131 of the sensor plate 130, and they are fixed by an adhesive. By such a modified configuration, the top face of the transparent plate 122 and the top face of the sensor holder 130 can be made at the sale level, so that the optical sensor, the optical unit or the camera using them can be made further smaller and thinner.

Alternatively, it is possible that the transparent plate 122 serves as the sensor holder 130 and the top surface of the transparent plate 122 except a center rectangular region facing the opening 123a of the flexible printed circuit substrate 123 or the photo-sensing surface of the sensor chip 121 is coated by a material having a light shielding effect.

In the second embodiment, the sensor chip 121 and the flexible printed circuit substrate 123 are reinforced by the sensor holder 130, so that the transparent plate 122 can be omitted, if the photo-sensing surface of the sensor chip 121 can be coated by a transparent material for protecting it. When the transparent plate 122 can be omitted, the optical sensor, the optical unit and the camera using them can be made still furthermore smaller and thinner.

In the above-mentioned first and second embodiments, the optical axes of the optical elements held on the lens holders 10 and 110 are bent by the mirror 3. However, the optical units 1 and 100 or the lens folders 10 and 110 are not restricted by the above-mentioned configurations. It is possible that the optical axis of the optical elements not including the mirror can be made a straight one.

Furthermore, the use of the optical sensor of the optical unit is not the AF sensor of the camera. The configuration of this invention can be applied to any optical sensor or any optical unit having at least a photo-sensing device which can be used in not only an optical equipment such as a camera but also an electric equipment such as an optical disc reader, and so on.

Although the present invention has been fully described by way of example with reference to the accompanying drawings, it is to be understood that various changes and modifications will be apparent to those skilled in the art.

Therefore, unless otherwise such changes and modifications depart from the scope of the present invention, they should be construed as being included therein.

What is claimed is:

1. An optical sensor comprising:
   a sensor module including a sensor chip having at least a photo-sensing device provided thereon and a flexible printed circuit substrate having conductive patterns to which the photo-sensing device is connected; and
   a sensor holder for positioning the sensor module at a light exit opening portion of a base member of an optical unit which holds at least an optical element for guiding an incident light to the sensor module, a surface of the sensor holder having a concave cavity and at least two recesses, the sensor chip being contained in the concave cavity and the sensor module being fixedly attached the sensor holder at the recesses.

2. The optical sensor in accordance with claim 1, wherein the photo-sensing device is connected to the conductive patterns by way of the surface of the sensor chip on which the photo-sensing device is provided.

3. An optical sensor comprising:
   a sensor module including:
      a transparent plate;
      a sensor chip provided with at least a photo-sensing device; and
      a flexible printed circuit substrate having:
         conductive patterns to which the photo-sensing device is connected; and
         an opening, wherein
            the sensor chip is disposed for facing the transparent plate through the opening of the flexible circuit substrate; and
   a sensor holder for positioning the sensor module at a light exit opening portion of a base member of an optical unit which holds at least an optical element for guiding an incident light to the sensor module, a surface of the transparent plate being adhered to a surface of the base member.

4. The optical sensor in accordance with claim 3, wherein the sensor holder positions the sensor module at the light exit opening portion of the base member of the optical unit in a manner so that a photo-sensing surface of the sensor chip crosses at a predetermined angle to an optical axis of the optical element.

5. An optical sensor comprising:
   a sensor module including:
      a transparent plate;
      a sensor chip provided with at least a photo-sensing device; and
      a flexible printed circuit substrate having:
         conductive patterns to which the photo-sensing device is connected; and
         an opening, wherein
            the sensor chip is disposed for facing the transparent plate through the opening of the flexible circuit substrate; and
   a sensor holder for positioning the sensor module at a light exit opening portion of a base member of an optical unit which holds at least an optical element for guiding an incident light to the sensor module, wherein
      the sensor holder has a cover portion for enclosing the sensor chip and is fixed on the transparent plate.

6. The optical sensor in accordance with claim 5, wherein the transparent plate has a size larger than that of the sensor chip, the cover portion of the sensor holder is a cavity having a size larger than that of the sensor chip, side walls of the cavity of the sensor holder serves as a fixing portion, and the fixing portion of the sensor holder is fixed on a surface of the transparent plate directly or via the flexible printed circuit substrate.

7. An optical sensor comprising:
   a sensor module including:
      a transparent plate;
      a sensor chip provided with at least a photo-sensing device; and
      a flexible printed circuit substrate having:
         conductive patterns to which the photo-sensing device is connected; and
         an opening, wherein
            the sensor chip is disposed for facing the transparent plate through the opening of the flexible circuit substrate; and
   a sensor holder for positioning the sensor module at a light exit opening portion of a base member of an optical unit which holds at least an optical element for guiding an incident light to the sensor module, wherein
      the sensor holder is provided between the transparent plate and the flexible printed circuit substrate of the sensor module.

8. The optical sensor in accordance with claim 7, further comprising an aperture for restricting a part of incident light reaching to the sensor chip through the transparent plate.

9. The optical sensor in accordance with claim 8, wherein the aperture is formed on the sensor holder.

10. The optical sensor in accordance with claim 8, wherein the aperture has a size permitting the incident light reaching only a portion on the photo-sensing surface of the sensor chip where the photo-sensing device id formed.

11. The optical sensor in accordance with claim 3, wherein the sensor holder is provided around an outer periphery of the transparent plate.

12. The optical sensor in accordance with claim 3, wherein the photo-sensing device is connected to the conductive patterns by way of the surface of the sensor chip on which the photo-sensing device is provided.

13. An optical unit comprising:
   a sensor module including:
      a transparent plate;
      a sensor chip provided with at least a photo-sensing device; and
      a flexible printed circuit substrate having:
         conductive patterns to which the photo-sensing device is connected; and
         an opening, wherein
            the sensor chip is disposed for facing a surface of the transparent plate through the opening of the flexible circuit substrate;
   a base member for holding at least an optical element which guides incident light to the sensor module, and having a positioning portion to which another surface of the transparent plate contacts for positioning the sensor chip with respect to the optical element and a fixing portion to which the sensor module is fixed; and
   a sensor holder for positioning the sensor module at a light exit opening portion of the base member.

14. The optical unit in accordance with claim 13, wherein the sensor holder positions the sensor module at the light exit opening portion of the base member of the optical unit in a manner so that a photo-sensing surface of the sensor chip crosses at a predetermined angle to an optical axis of the optical element.

15. The optical unit in accordance with claim 13, wherein the sensor holder has a cover portion for enclosing the sensor chip and is fixed on the transparent plate.

16. The optical unit in accordance with claim 15, wherein the transparent plate has a size larger than that of the sensor chip, the cover portion of the sensor holder is a cavity having a size larger than that of the sensor chip, side walls of the cavity of the sensor holder serves as a fixing portion, and the fixing portion of the sensor holder is fixed on a surface of the transparent plate directly or via the flexible printed circuit substrate.

17. The optical unit in accordance with claim 13, wherein the fixing portion of the base member is formed in a manner so that a gap is formed between the fixing portion and the sensor holder when the transparent plate contacts the positioning portion of the base member.

18. The optical unit in accordance with claim 13, wherein the base member has a light shielding portion formed to protrude toward the sensor holder for shielding a part of external incident light so as not to reach the sensor module.

19. The optical unit in accordance with claim 13, wherein the photo-sensing device is connected to the conductive patterns by way of the surface of the sensor chip on which the photo-sensing device is provided.

20. An optical unit comprising:
   a sensor module including:
      a transparent plate;
      a sensor chip provided with at least a photo-sensing device; and
      a flexible printed circuit substrate having:
         conductive patterns to which the photo-sensing device is connected; and
         an opening, wherein
            the sensor chip is disposed for facing the transparent plate through the opening of the flexible circuit substrate;
   a sensor holder for holding the sensor module which is provided between the transparent plate and flexible printed circuit substrate of the sensor module and has a first fixing portion formed in the vicinity of an outer periphery thereof; and
   a base member for holding at least an optical element which guides incident light to the sensor module, and having a second fixing portion to which the first fixing portion contacts for positioning the sensor chip with respect to the optical element and for fixing the sensor holder to the base member.

21. The optical unit in accordance with claim 20, further comprising an aperture for restricting a part of incident light reaching to the sensor chip through the transparent plate.

22. The optical unit in accordance with claim 21, wherein the aperture is formed on the sensor holder.

23. The optical unit in accordance with claim 21, wherein the aperture has a size permitting the incident light reaching only a portion on the photo-sensing surface of the sensor chip where the photo-sensing device id formed.

24. The optical unit in accordance with claim 20, wherein the sensor holder is provided around an outer periphery of the transparent plate.

25. The optical unit in accordance with claim 20, wherein the photo-sensing device is connected to the conductive patterns by way of the surface of the sensor chip on which the photo-sensing device is provided.

26. A sensor unit comprising:
   a transparent plate capable of transmitting light;
   a sensor chip provided with a photo-sensing device for sensing light transmitted through the transparent plate, the sensor chip having a surface in fixed contact with a surface of the transparent plate;
   a flexible printed circuit substrate electrically connected with the photo-sensing device; and
   a holder fixedly attached on the transparent plate, the holder having a shape capable of enclosing the sensor chip.

27. The sensor unit in accordance with claim 26, wherein the holder is provided between the transparent plate and the flexible printed circuit substrate.

28. The sensor unit in accordance with claim 26, wherein the transparent plate has a size larger than that of the sensor chip, the holder is formed with a cavity having a size larger than that of the sensor chip, side walls of the cavity serves as a fixing portion, and the fixing portion of the holder is fixedly attached to a surface of the transparent plate directly or via the flexible printed circuit substrate.

29. A sensor unit comprising:
   a transparent plate capable of transmitting light;
   a holder having opposing sides and fixedly attached with the transparent plate on one of the opposing sides thereof, the holder being formed with an opening and adapted to mount the sensor unit on other parts of a combination that includes the sensor unit;
   a sensor chip provided with a photo-sensing device for sensing light passed through the opening and the transparent plate, the sensor chip being fixedly attached to the other of the opposing sides of the holder; and
   a flexible printed circuit substrate electrically connected with and fixedly attached to the sensor chip.

30. The sensor unit in accordance with claim 29, wherein the photo-sensing device is connected to the flexible printed circuit substrate by way of the surface of the sensor chip on which the photo-sensing device is provided.

* * * * *